United States Patent [19]
Delfino et al.

[11] Patent Number: 5,789,318
[45] Date of Patent: Aug. 4, 1998

[54] USE OF TITANIUM HYDRIDE IN INTEGRATED CIRCUIT FABRICATION

[75] Inventors: Michelangelo Delfino, Los Altos; Ronald C. McFarland, Mountain View, both of Calif.

[73] Assignee: Varian Associates, Inc., Palo-Alto, Calif.

[21] Appl. No.: 606,164

[22] Filed: Feb. 23, 1996

[51] Int. Cl.$^6$ ............................................. H01L 21/285
[52] U.S. Cl. .................. 438/656; 438/679; 438/664; 438/685; 438/683; 204/192.17
[58] Field of Search .................. 438/656, 658, 438/679, 683, 685, 664; 204/192.17

[56] References Cited

U.S. PATENT DOCUMENTS

| | | | |
|---|---|---|---|
| 5,043,300 | 8/1991 | Nulman | 437/200 |
| 5,415,829 | 5/1995 | Ohhashi et al. | 419/23 |
| 5,464,520 | 11/1995 | Kano et al. | 204/298.13 |
| 5,563,100 | 10/1996 | Matsubara | 438/683 |
| 5,595,784 | 1/1997 | Kaim et al. | 427/255.2 |

FOREIGN PATENT DOCUMENTS

| | | |
|---|---|---|
| 59-105364 | 6/1984 | Japan. |
| 62-72585 | 3/1987 | Japan. |
| 2-96374 | 4/1990 | Japan. |
| 4-232260 | 8/1992 | Japan. |
| 7-283220 | 10/1995 | Japan. |
| WO 94/24697 | 10/1994 | WIPO. |

OTHER PUBLICATIONS

C.A. Gaw et al., J. Appl. Phys. 59(9)(1986) 3274 "Formation of titanium hydrides in (Al, Ga) As . . . laser contacts . . . ", May 1986.

Ando et al., "Novel Salicide Technology using Ti Hydrogenation for 0.1–μm CMOS", IEEE, Nov. 6, 1996, pp. 16–17.

Kumar et al., "Paladium Silicide Contact Resistance and Yield Improvement", *IBM Technical Disclosure Bulletin*, Jan. 1981, vol. 23, No. 8.

Tzong–sheng Chang er al., "Thermal Stability Study of TiN/TiSi$_2$ Diffusion Barrier Between Cu and N$^{30}$ Si", *J. Appl.Phys.* 75 (12), 15 Jun. 1994, pp. 7847–7851.

H. D. Bender et al., "AES and XPS Analysis of the Interaction of Ti with Si and SiO$_2$ During RTA", *Applied Surface Science* 38 (1989), pp. 37–47.

Wilman Tsai et al., "Effect of Electron Cyclotron Resonance H$^+$, Ne$^+$, Ar$^+$and Xe$^+$Plasma Precleaning on Titanium Silicide Formation", *IEEE Transactions on Electron Devices*, vol. 41, No. 8, Aug. 1994.

J. Donnelly et al., "Characterisation of Furnace–Annealed TiSi$_2$ For VLSI Circuit Applications", *Applied Surface Science* 38 (1989), pp. 447–457.

Primary Examiner—Charles L. Bowers, Jr.
Assistant Examiner—Leon Radomsky
Attorney, Agent, or Firm—Gerald M. Fisher

[57] ABSTRACT

An improved process for forming titanium silicide layers on semiconductor device silicon regions which have native oxide thereon utilizes a reactively sputter deposited layer of TiH$_{x \leq 2}$ followed by a rapid thermal anneal in a nitrogen bearing gas. This process results in lowered silicidation activation energy and lower anneal temperature requirements. Production throughput is improved with respect to prior art methods of removing the native oxide or minimizing its negative effect on silicide formation. The same process produces a titanium nitride/titanium silicide bilayer on silicon, and a titanium nitride/titanium bilayer on silicon dioxide. The thickness of the titanium nitride layer over silicon dioxide is enhanced by the use of TiH$_{x \leq 2}$ in place of Ti layers used in prior art, thus improving the utility of the titanium nitride as a diffusion barrier layer.

25 Claims, 4 Drawing Sheets

USE OF TITANIUM HYDRIDE IN INTEGRATED CIRCUIT FABRICATION

FIELD OF THE INVENTION

This invention relates to processes for the formation of multiple layer metal/semiconductor contact and metallization structures utilizing titanium silicides and nitrides employed in integrated circuit processing.

BACKGROUND OF THE INVENTION

Integrated circuits are becoming increasingly fast in response time, with smaller feature sizes, and are continually becoming cheaper to produce. There are many design and manufacturing issues which impact both of these areas.

Lowering of production costs, resulting in cheaper products, can be achieved in many ways, including 1) increasing throughput by simplifying the process or reducing the number of process steps; 2) doing batch processing rather than single-wafer processing; 3) reduction of contamination-induced defects, thereby increasing yield; or 4) reducing wafer handling by automating processes or process sequences. One method for accomplishing goals 3) and 4) is to use an integrated cluster tool, which provides for doing multiple process steps within a single vacuum system consisting of several process chambers arranged around a central vacuum transfer chamber, each process chamber being isolated from the central vacuum chamber by a vacuum lock through which the wafers are passed to accomplish one or more of the process steps involved in the total process. Automated gate valves, comprising part of the vacuum locks, in conjunction with automated pumping sequences, provide for passage of the wafers in and out of the multiple process chambers in an appropriate sequence of process steps without cross contamination of the environments in the different process chambers, thus providing optimum contamination-free environments for each step in the process. As this method generally involves single-wafer rather than batch processing, throughput becomes an especially critical issue.

Reducing the number of process steps is a particularly important factor in minimizing production costs, since it simultaneously tends to reduce contamination due to wafer handling and increases throughput. This factor is important in both the batch processing environment and in the single-wafer processing environments such as the integrated cluster tool, perhaps more so in the latter because of the greater impact of the incremental increase in throughput in this naturally lower-throughput environment.

A crucial issue involved in speeding up integrated circuit response time is contact technology. The devices and other elements of the circuits are electrically connected by metallic interconnects, which must in general make stable, reliable, low resistance ohmic contacts to the active semiconductor devices. Generally the higher the resistance of these metal-semiconductor contacts, the poorer the circuit response time. This effect becomes more pronounced as device and circuit dimensions decrease. Extensive effort has been devoted to the development of contact technology schemes and structures. One such structure, which is widely used, incorporates a thin adhesion layer of low sheet resistance titanium silicide on the Si and a thin barrier layer of titanium nitride between the titanium silicide and the interconnect metal. The barrier layer serves to retard any reaction between the interconnect metal and the device. An application of this structure is the self-aligned silicide (or salicide) process used in MOS processing. In this process, the silicide/nitride bilayer is formed over the source/drain and the gate regions of the devices, which are separated from one another by oxide sidewall spacers.

A common method of forming the silicide layers is first to deposit a layer of Ti metal onto a Si surface, followed by a first rapid thermal annealing (RTA1) step. The annealing temperature must be high enough to form the meta-stable, higher resistivity C-49 phase of titanium silicide on the Si surface, but must be below the temperature at which titanium would chemically reduce with $SiO_2$. The unsilicided Ti is then selectively removed without etching the C-49 phase Ti-Si compounds. A higher temperature second RTA2 step then converts the C-49 phase silicide into the stable, low resistivity C-54 phase. During the formation of $TiSi_2$, Si is the dominant diffusing species, thus during the first anneal step, Si from the substrate (source/drain) or gate regions can diffuse into the deposited metal over the sidewall or spacer oxides. This effect, known as silicide overgrowth, can cause bridging, resulting in shorting of the source/drain to the gate. The anneal time/temperature must be kept low enough to avoid this effect. Lowering the RTA times and temperatures has the added benefit of minimizing dopant redistribution during the anneal step, thus minimizing degradation of device characteristics.

Silicide formation is inhibited by the presence of a thin native silicon dioxide layer between the Si and Ti layers. In addition to having detrimental effects on the smoothness and uniformity of the silicide, the native oxide layer increases the activation energy barrier to silicide formation, which must be overcome by the first thermal heating step. Presence of the oxide thus necessitates higher temperature and/or longer time for the anneal, with all the above-mentioned resultant problems.

In order to optimize the formation of the silicide layer, several methods have been used to either remove the native oxide layer or minimize its negative effect. Wet chemical etch followed by Ar plasma high-energy ion bombardment has been utilized, but this method has several disadvantages, including: 1) It is incompatible with cluster tool processing; 2) Wet etch may be ineffective for high aspect ratio contact openings; 3) Wet etch must be done immediately before metallization to avoid oxide regrowth in the contact openings.

Another method which has been used is ion beam mixing, whereby the native oxide is broken up (though not removed) by a large dose of ions implanted through the Ti layer, creating a larger, more uniformly scattered number of pinholes than would normally be found in the native oxide layer. Since the Ti/Si reaction first begins in the area of these pinholes, the ion beam mixing allows a more uniform reaction to take place, resulting in a smoother silicide film. This method also has several disadvantages:

1) High-dose implantation is expensive and time-consuming; 2) The presence of the oxygen atoms remaining at the Si-Ti interface after ion bombardment serves as a kinetic barrier for silicidation, thereby raising the required anneal temperature. This effect is magnified by any amorphization of the surface layer of Si due to the bombardment.

More recently, removal of the native oxide from the Si surface by exposure to hydrogen at high temperature, or by exposure to a hydrogen plasma for a short time, has been reported. Using either of these methods, the hydrogen reduces the native oxide layer, resulting in a virtually oxygen-free, Si-H terminated surface, which promotes silicidation of the subsequently-deposited Ti layer. However, as in all of the above-mentioned methods, the necessity of a separate step for modifying or removing the native oxide is costly in terms of throughput, particularly in a single-wafer processing environment such as a cluster tool.

Formation of the TiN barrier layer on top of the $TiSi_2$ has been accomplished by depositing a layer of TiN over the already silicided Ti. Alternatively, the bilayer could be formed by simultaneous silicidation and nitridation of the Ti, since during the RTA silicidation step, when performed in a nitrogen ambient, a top layer of titanium nitride will form, in some cases in competition with the silicide formation. The TiN could also be formed in a separate Ti deposition-nitrogen anneal step after silicide formation was completed. Combinations of the above methods might also be used. Oxidation of the Ti surface has been shown to inhibit the nitridation reaction.

Various methods have been employed for depositing the layers utilized in formation of the multilayer contact structures. These include vacuum evaporation, simple sputter deposition, and reactive ion sputter deposition. This last method involves sputtering of a target by energetic ionized particles, which may be produced in a plasma environment, followed by reaction of the sputtered particles with a reactive gas phase species from the ambient. All of these methods are well suited to the cluster tool environment.

SUMMARY OF THE INVENTION

We have discovered an improved process for forming a low sheet resistance $TiSi_2$ layer on Si, and for producing a $TiN/TiSi_2$ bilayer. A similar process forms a TiN/Ti structure on $SiO_2$. This improved process, which has potential application in contact structures and interconnect metallization for integrated circuits, utilizes deposition of titanium hydride films onto the surface of the wafer.

It is an object of this invention to provide an improved process to make low sheet resistance $TiSi_2$ layers on $n^+$ or $p^+$ single crystal silicon as well as polysilicon gates.

It is a further object to provide a process which lowers the activation energy barrier to titanium silicide formation.

It is a further object to provide a process which minimizes the anneal temperature/time for formation of the C-49 phase of titanium silicide.

It is a further object to provide a titanium silicidation process which removes the native oxide at the Si surface but does not require a separate oxide removal step.

It is a further object to provide a titanium silicidation process which utilizes hydrogen incorporated into a deposited Ti layer to reduce the native oxide at the Si surface.

It is a further object to provide a titanium silicidation process which maximizes throughput.

It is a further object to provide a process which simultaneously forms a $TiSi_2$ layer and a TiN diffusion barrier layer above it.

It is a further object to provide a process for forming a TiN/Ti bilayer on $SiO_2$ surfaces which promotes a sufficiently thick TiN layer for use as a diffusion barrier.

It is a further object to provide a process for forming $TiN/TiSi_2$ and TiN/Ti bilayers which can be implemented in an integrated cluster tool environment.

It should be noted that the figures are not necessarily drawn to scale and that the proportions of the illustrated parts do not reflect actual dimensions which are used in the implementation of the invention.

DETAILED DESCRIPTION OF THE INVENTION

According to this invention, a layer of titanium hydride is deposited on Si and $SiO_2$ surfaces (in place of the Ti layer conventionally being used in prior art processes) during the processing to form the multi-layer silicide adhesion layer/diffusion barrier structures for integrated circuit metallization.

Figure 1:
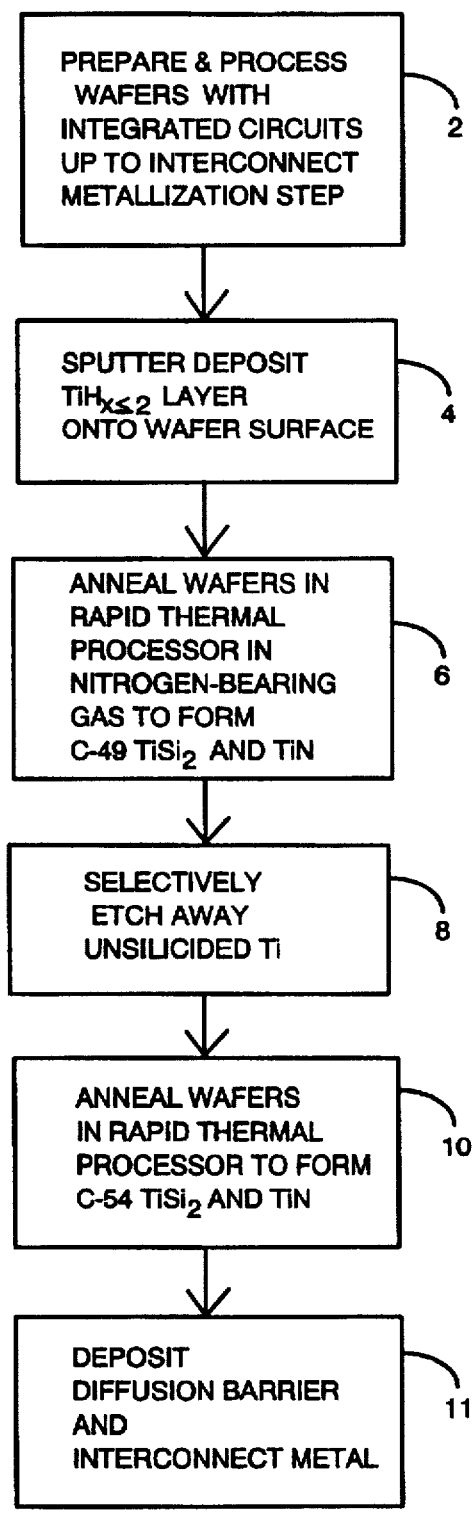
FIG. 1 is a preferred process flow embodiment utilizing the invention.

With reference to FIG. 1, a possible process flow utilizing this invention for silicide formation is described. In Step 2, an integrated circuit wafer is processed up to the metallization steps, utilizing conventional processes. For example, in CMOS technology, the source/drain regions and gates are formed and defined. In Step 4, the wafer is installed in a sputter deposition chamber, such as a sputter module of an integrated cluster tool, and a layer of titanium hydride is sputter deposited on the wafer surface, covering surface regions of Si and $SiO_2$. In Step 6, the wafer is installed in a Rapid Thermal Processor (RTP), and the first Rapid Thermal Anneal (RTA1) step is performed in a nitrogen or nitrogen-bearing ambient environment, forming a titanium nitride/titanium silicide bilayer on the Si surfaces. In Step 8, the unsilicided Ti and TiN is removed by selective etch which does not appreciably affect the silicide layer. In Step 10, the second Rapid Thermal Anneal (RTA2) step is performed to form the stable lowest resistivity C-54 phase of titanium silicide. In Step 11, the diffusion barrier layer and high conductivity interconnect metal are deposited.

Figure 2:
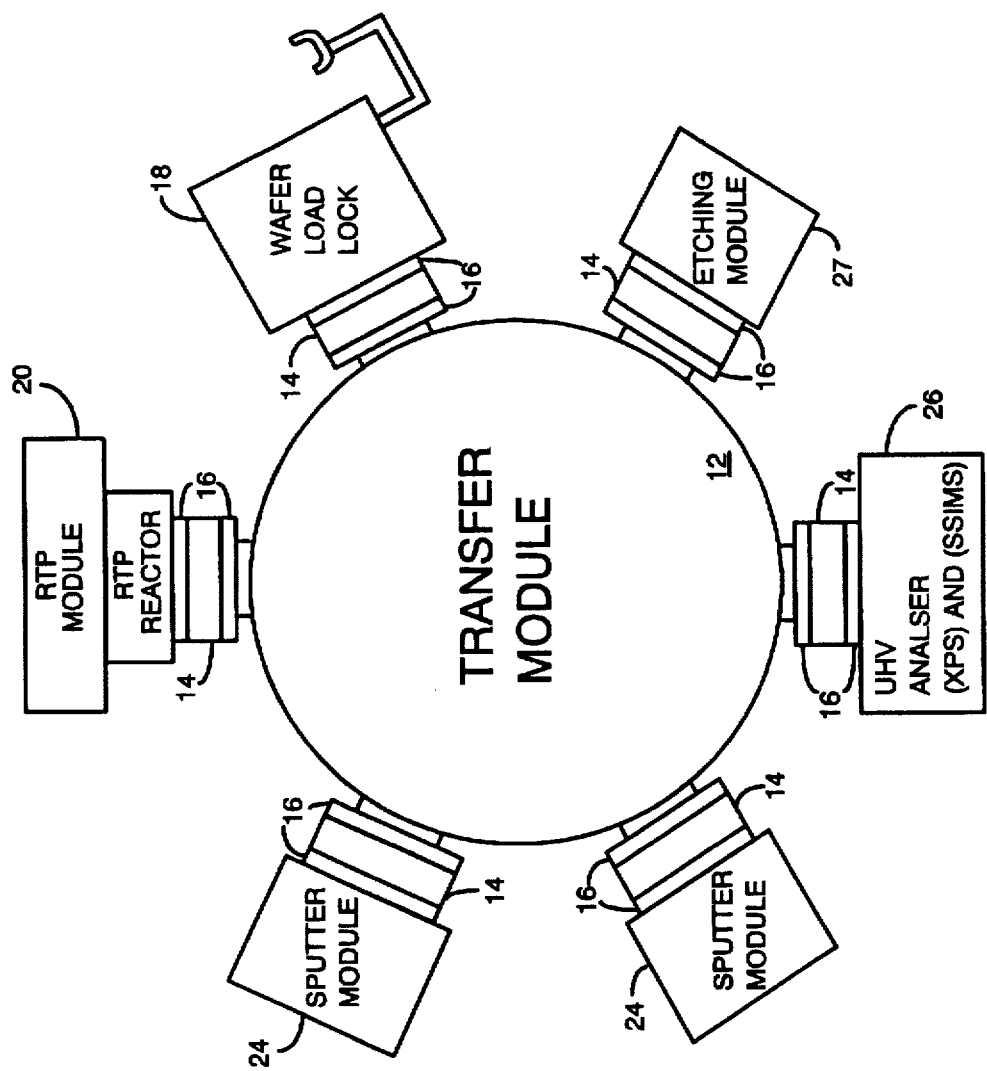
FIG. 2 is a schematic drawing of an integrated cluster tool as used in the inventive process.

With reference to FIG. 2, a configuration of an integrated cluster tool as used in accordance with this invention is shown, with individual process modules communicating with central transfer chamber 12 via load locks e.g. 14, each having associated dual gate valves 16 and 17. Wafers enter the cluster tool vacuum environment through wafer load lock 18, and can thereafter be transferred to any of the process modules by an electromechanical transfer mechanism (not shown). Shown are an RTP module 20 for performing the rapid thermal anneals, two sputter modules 24 and 25 used for deposition and sputter etch process steps respectively, and an analyzer module 26 often utilized in the research environment for characterizing surface layers and optimizing processes. This analyzer module may include tools such as an x-ray photoelectron spectrometer (XPS), or a static secondary ion mass spectrometer (SSIMS).

Figure 3:
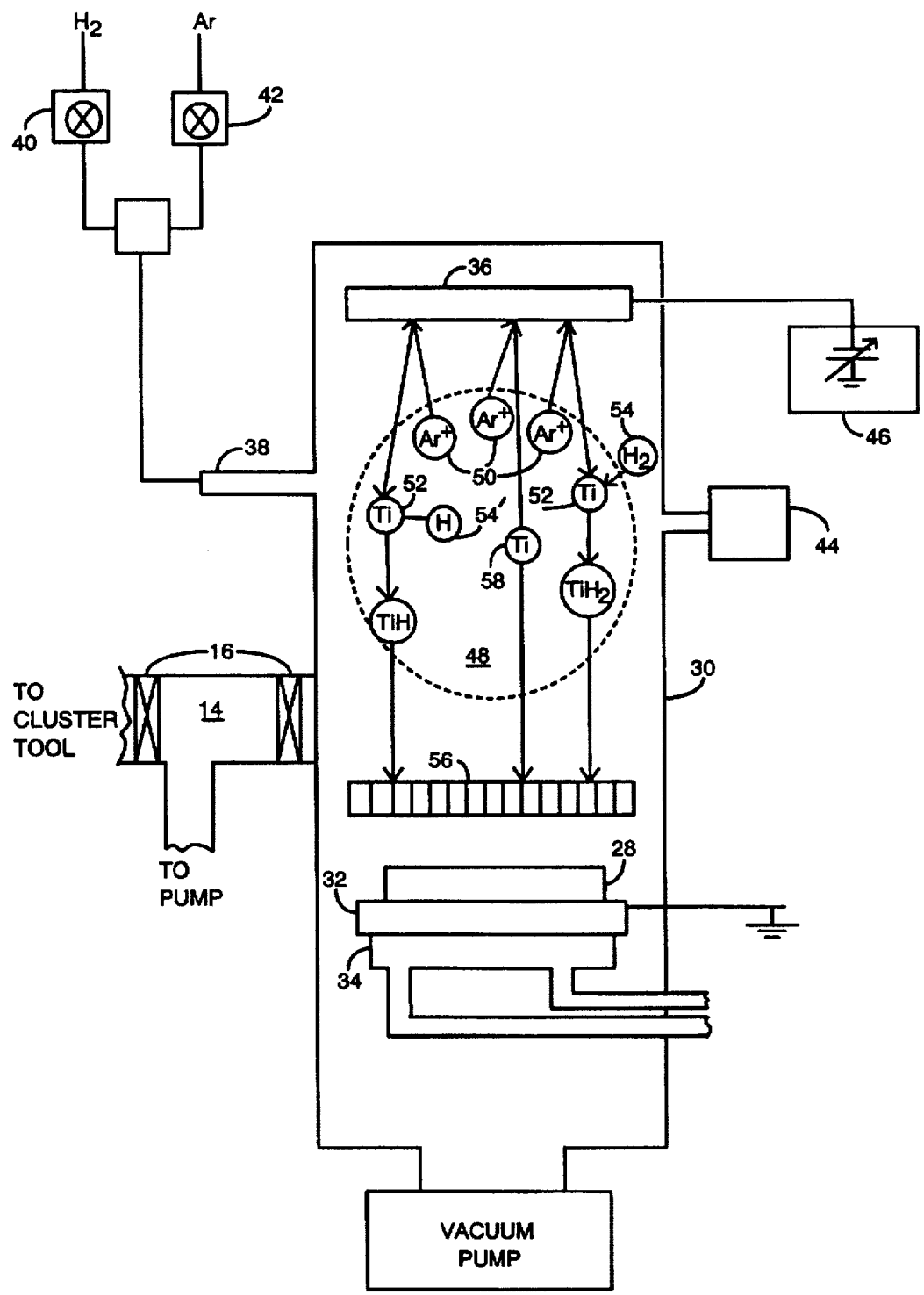
FIG. 3 is a schematic drawing of a reactive sputter deposition apparatus used in the inventive process; and, FIG. 4 is a graph of sheet resistance vs reciprocal anneal temperature for structures formed from Ti/Si(100) and $TiH_{x \leq 2}/Si(100)$.

With reference to FIG. 3, a preferred method for depositing the $TiH_{x \leq 2}$ layer in accordance with this invention is reactive sputter deposition. A substrate, e.g. a wafer, 28 is transferred from central transfer chamber (not shown) into evacuated sputter deposition chamber 30 through vacuum lock 14. Substrate 28 is placed onto substrate holder 32 by a mechanical transfer mechanism (not shown). The substrate holder temperature is controlled by heating/cooling system 34. Titanium target 36 is at a negative voltage with respect to substrate 28. Hydrogen and argon gases are introduced into sputter chamber 30 through inlet valve 38, the gases having variable flow rates being controlled by hydrogen flow valve 40 and argon flow valve 42 respectively. The flow ratio of argon to hydrogen can be varied. The Ar flow rate is typically 10–200 SCCM and the $H_2$ flow rate range is ten (10%) percent of the predetermined Ar flow rate. Pressure gauge 44 measures total gas pressure in sputter deposition chamber 30. Total pressure is typically in the range of 2–12 mTorr. RF Energy source 46 is coupled to the chamber, operating to ionize hydrogen and argon gases, resulting in $Ar/H_2$ plasma 48. The RF source 46 includes a variable DC voltage source electrically connected to provide a DC bias to target 36. The power coupled to this plasma is a function of the energy source voltage and other system parameters. Power is typically in the ranges from 5–24 kW. Positive argon ions, $Ar^+$, 50 bombard negative charged Ti target 36, causing Ti atoms 52 to be sputtered off the target into plasma region 48. Titanium atoms, Ti, then react with hydrogen atoms, H, 54, possibly forming molecular species TiH and/or $TiH_2$, some of which pass through collimator 56 to impact substrate 28 in a direction substantially perpendicularly to its surface. These molecular species combine with unreacted sputtered titanium, Ti, atoms 58 to form a deposited layer of titanium hydride 59 on the substrate. The exact value of the hydrogen-to-titanium ratio, x, depends upon process parameter details such as hydrogen and argon flow rates, etc. The titanium hydride layer 59 composition is therefore referred to as $TiH_{x \leq 2}$.

In operation, films of $TiH_{x \leq 2}$ have been reactively sputter deposited onto amorphous $SiO_2$ substrates having 100 nm of thermal oxide, and then characterized using several analytical techniques to determine properties of these films, and their sensitivity to variations in process parameters. The collimator between the target and the substrate typically has a 1.5:1 aspect ratio, and is generally comprised of hexagonally shaped cells. Substrate temperature should not exceed 50° C. during the deposition process. Gas pressure, e.g. 2.9 mtorr, and target power, e.g. 2.9 kW, are kept substantially constant during sputtering. Films have been prepared with $H_2$ flow rate varying from 0 to 15 sccm, and with Ar flow rate remaining substantially constant at 50 sccm. X-ray diffraction patterns taken with Cu generated $K\alpha$ radiation show that, in the absence of $H_2$ flow, a highly textured (100) Ti layer is deposited, but diffraction peaks characteristic of $TiH_{x \leq 2}$ are seen for films deposited with at least 10 sccm $H_2$ flow rate. Presence of Ti-H bonds in these deposited films is indicated by X-ray photoemission spectra using Al generated $K\alpha$ radiation, whereby characteristic shifts are seen in the binding energies of core Ti electrons, indicative of a +2 change in Ti oxidation state, and therefore consistent with the formation of Ti-H bonds.

TABLE I

Effect of gas composition on sheet resistance and resulting film thickness

| $H_2$/Ar flow ratio (sccm) | Resistance (ohms) | Film Thickness (nm) |
| --- | --- | --- |
| 0/50 | 15.7 | 45.8 |
| 5/50 | 16.5 | 43.6 |
| 10/50 | 17.8 | 44.7 |
| 15/50 | 18.2 | 43.4 |

Table I is a table of film characteristics as a function of relative $H_2$/Ar flow in the gas plasma. Film thickness is measured using X-ray fluorescence mapping (13-point) assuming the deposited film to have mass density of 4.5 $g/cm^3$, film thickness being verified with profilometry. Sheet resistance is measured with a four-point probe mapping (49 point) system. It is seen that deposited film thickness is relatively invariant to the hydrogen flow, but that film sheet resistance increases monotonically as the hydrogen flow increases. This increase in sheet resistance is further evidence of the level of Ti-H bonding.

TABLE II

Reflectivity at 44 nm wavelength and sheet resistance for annealed $TiH_{x \leq 2}/SiO_2$, $Ti/SiO_2$, $TiH_{x \leq 2}/Si$, and $Ti/Si$ films.

| Film/Substrate | Reflectivity | Resistance (ohms) |
| --- | --- | --- |
| $TiH_{x \leq 2}/SiO_2/Si$ | 0.368 | 22.1 |
| $Ti/SiO_2/Si$ | 0.381 | 21.6 |
| $Ti/Si$ | 0.408 | 1.7 |
| $TiH_{x \leq 2}/Si$ | 0.412 | 1.7 |

Figure 4:
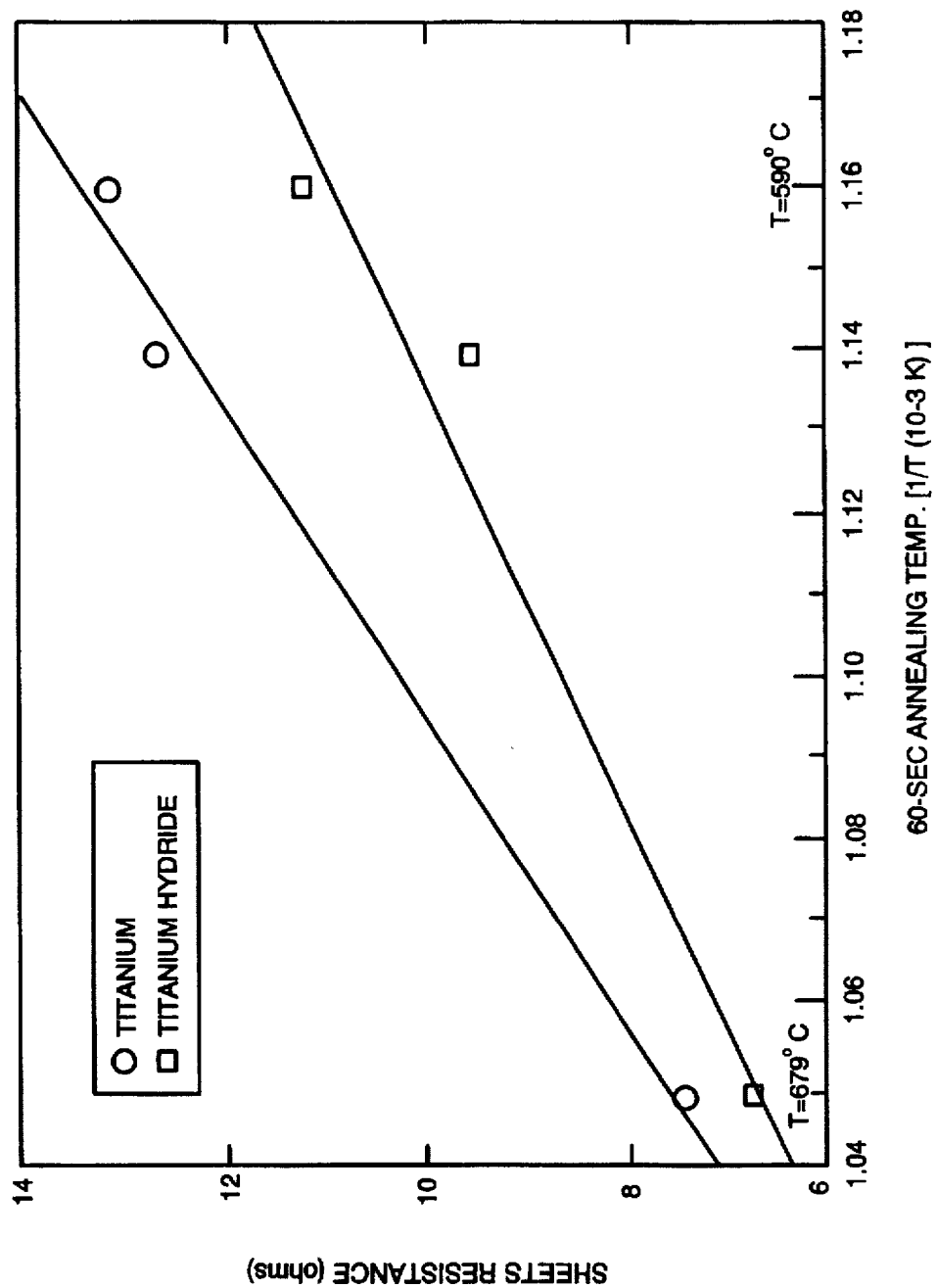

With respect to FIG. 4 and Table II, formation of $TiN/TiSi_2$ and $TiN/Ti$ bilayers has been accomplished by first depositing $TiH_{x \leq 2}$ films as described above, using 50 sccm rate of hydrogen flow, on Si(100) and amorphous $SiO_2$ substrates respectively; then, following deposition and before exposure to ambient gas, performing a rapid thermal anneal (RTA) for 60 seconds in 2 torr nitrogen, at plateau temperatures ranging from 590° C. to 810° C. These bilayer structures are analyzed for reflectivity, measured at 44 nm wavelength, and sheet resistance, using an optical mapping (49 point) system. Comparison is made with bilayer structures formed by the same process, using deposited Ti layers.

FIG. 4 is a graph of sheet resistance as a function of reciprocal annealing temperature, for the structures resulting from deposition of $TiH_{x \leq 2}/Si(100)$ layers compared to those from equivalently thick Ti/Si(100) layers, after 60 seconds of anneal in 2 torr nitrogen. Correspondence with anneal temperature in ° C., ranging from 590° C. to 679° C., is noted on the abscissa. The resultant activation energies for these two silicidation reactions are directly proportional to the slopes of the two graphed lines. The activation energy for silicidation is significantly lower for deposition of a $TiH_{x \leq 2}$ layer than for the deposition of a Ti layer, being approximately 1.4 ev and 2.2 ev respectively. Reduction in activation energy using a $TiH_{x \leq 2}$ layer is greater than that achieved by prior art plasma precleaning methods for oxygen removal, including hydrogen plasma treatment.

Table II displays reflectivity and sheet resistance measurements for structures resulting from the thin film combinations of $TiH_{x \leq 2}/SiO_2$, $Ti/SiO_2$, $TiH_{x \leq 2}/Si$, and $Ti/Si$. The measurements are made after 60 seconds of anneal in 2 torr nitrogen at 810° C. The sheet resistance and reflectivity values are substantially the same for $TiH_{x \leq 2}/Si$ and $Ti/Si$ films. At this anneal temperature, the low resistivity C-54 phase of $TiSi_2$ has been formed. The $TiSi_2$ layer dominates the higher resistivity TiN layer in determining the bilayer sheet resistance value, since the silicide and nitride layers act as parallel resistors in contributing to bilayer sheet resistance measurements. It follows that C-54 $TiSi_2$ layers of substantially equivalent thicknesses have resulted from the Ti/Si (100) and $TiH_{x \leq 2}/Si(100)$ films.

Comparison of the annealed TiN/Ti bilayer structures resulting from the depositions of $TiH_{x \leq 2}$ and Ti, respectively, onto $SiO_2$, shows a lower reflectivity and a higher sheet resistance for the former. Both measurements correspond to a thicker nitride layer resulting from the deposition of $TiH_{x \leq 2}$ than from the deposition of Ti onto the $SiO_2$.

The use of $TiH_{x \leq 2}$ films in place of Ti films during formation of $TiSi_2$ contacts favorably reduces that activation energy associated with the silicidation reaction from that associated with prior art process methods. This is because, during the RTA1 step, the hydrogen effuses from the $TiH_{x\leq 2}$ and reduces the interfacial native oxides to water. Therefore, RTA temperatures and/or times can be lowered, minimizing bridging and dopant redistribution effects. An additional advantage to using $TiH_{x\leq 2}$ layers is simplification of the process sequence. Deposition of a $TiH_{x\leq 2}$ layer is a single step process, in contrast to the multiple steps required to perform plasma oxide removal or hydrogen heat treatment followed by deposition of Ti metal. This simplification and shortening of the process sequence increases throughput. Yet another advantage of using $TiH_{x\leq 2}$ layers occurs in salicide processing, during the selective etch step to remove unsilicided Ti and TiN. Although this selective etch process is known in the prior art, it is achieved more reliably when the Ti originates from $TiH_{x\leq 2}$, thereby permitting a larger selective etch processing window.

As shown above, the use of $TiH_{x\leq 2}$ films during formation of TiN/Ti diffusion barriers by anneal in nitrogen-bearing ambient produces thicker nitride layers than are formed using Ti films. Due to the extremely reactive, "gettering" nature of Ti, thin Ti films readily absorb and adsorb oxygen, which inhibits the nitridation reaction. $TiH_{x\leq 2}$ is more oxidation resistant than Ti, and therefore is more favorable for the nitridation reaction. The TiN/Ti on $SiO_2$ structure has potential use in circuits as a conducting strap between devices, such strap having a diffusion barrier above it. Resistivity of TiN is sufficiently low and in some cases can be lower than pure metal and can act as a good electrical conductor.

$TiH_{x\leq 2}$ as applied to formation of silicide adhesion layers and nitride diffusion barriers may be utilized in a wide variety of process sequences, including formation of nitride/silicide bilayers on Si and nitride/titanium bilayers on $SiO_2$.

Although our preferred process deposits the $TiH_{x\leq 2}$ film by reactive sputter deposition and performs the deposition and anneal steps in an integrated cluster tool, it is not essential that this exact method be used.

It is not our intention to limit our invention to the particularities described herein with reference to the preferred embodiment, but rather the scope of our invention should be construed in view of our claims. With this in mind,

We claim:

1. In an integrated circuit manufacturing process for forming contact structures on a semiconductor device, said semiconductor device having a layer of native oxide on silicon, and on silicon dioxide, the improvement comprising, depositing a layer of $TiH_{x\leq 2}$ onto said native oxide; and
performing an anneal of said device.

2. The process of claim 1, wherein said step of performing an anneal further comprises performing a rapid thermal anneal.

3. The process of claim 2, wherein said $TiH_{x\leq 2}$ depositing step further comprises depositing by a reactive sputter deposition process.

4. An integrated circuit manufacturing process for making a titanium silicide layer on a silicon substrate, said substrate having at least one semiconductor device thereon, said device having a silicon surface region having a native oxide thereon, comprising the steps of, installing said silicon substrate in a vacuum chamber;
depositing a layer comprising Ti and H in the form $TiH_{x\leq 2}$ onto said silicon region of said device;
annealing said substrate and said $TiH_{x\leq 2}$ layer at a temperature high enough to cause Ti from said $TiH_{x\leq 2}$ layer and silicon from said silicon region underlying said $TiH_{x\leq 2}$ layer to chemically react to form a titanium silicide layer on said silicon region.

5. The process of claim 4, wherein said $TiH_{x\leq 2}$ depositing step is a reactive sputter deposition process.

6. The process of claim 5, wherein said reactive sputter deposition process comprises, installing a titanium target in said vacuum chamber;
providing an energy source coupled to said vacuum chamber;
flowing hydrogen and argon gas at flow rates into said chamber in a flow ratio, thereby producing a gas pressure in said vacuum chamber;
ionizing said hydrogen and said argon gases using power from said energy source, to form hydrogen and argon ions;
adjusting said argon flow rate, said hydrogen flow rate, said flow ratio, said gas pressure, and said power from said energy source so as to form a $TiH_{x\leq 2}$ layer on said substrate.

7. The process of claim 4, wherein said annealing step comprises a rapid thermal anneal.

8. The process of claim 7, wherein said $TiH_{x\leq 2}$ depositing step is a reactive sputter deposition process.

9. The process of claim 8, wherein said reactive sputter deposition process comprises, installing a titanium target in said vacuum chamber;
providing an energy source coupled to said vacuum chamber;
flowing hydrogen and argon gas at flow rates into said chamber in a flow ratio, thereby producing a gas pressure in said vacuum chamber;
ionizing said hydrogen and said argon gases using power from said energy source, to form hydrogen and argon ions;
adjusting said argon flow rate, said hydrogen flow rate, said flow ratio, said gas pressure, and said power from said energy source so as to form a $TiH_{x\leq 2}$ layer on said substrate.

10. The process of claim 9 wherein said argon flow rate range is 10–200 SCCM, said hydrogen flow rate range is at least ten percent of said Ar flow rate, said gas pressure range is 2–12 mTorr, and said power range is 5–24 KW.

11. In the process of claim 7, introducing a nitrogen bearing gas into said vacuum chamber after depositing said $TiH_{x\leq 2}$ layer but before said annealing step and before said $TiH_{x\leq 2}$ layer is exposed to an ambient atmosphere, such that a bilayer comprising a TiN layer atop a $TiSi_2$ layer forms during said annealing step.

12. The process of claim 11, wherein said $TiH_{x\leq 2}$ depositing step is a reactive sputter deposition process.

13. The process of claim 12, wherein said reactive sputter deposition process comprises, installing a titanium target in said vacuum chamber;
providing an energy source coupled to said vacuum chamber;
flowing hydrogen and argon gas at flow rates into said chamber in a flow ratio, thereby producing a gas pressure in said vacuum chamber;
ionizing said hydrogen and said argon gases using power from said energy source, to form hydrogen and argon ions;
adjusting said argon flow rate, said hydrogen flow rate, said flow ratio, said gas pressure, and said power from said energy source so as to form a $TiH_{x\leq 2}$ layer on said substrate.

14. The process of claim 13 wherein said argon flow rate range is 10–200 SCCM, said hydrogen flow rate range is at least ten percent of said Ar flow rate, said gas pressure range is 2–12 mTorr, and said power range is 5–24 KW.

15. In the process of claim 11, depositing a metal film atop said TiN layer, said metal film being made from a highly conductive material, said TiN layer forming a diffusion barrier between said semiconductor device and said metal film.

16. The process of claim 15, wherein said $TiH_{x \leq 2}$ depositing step is a reactive sputter deposition process.

17. The process of claim 16, wherein said reactive sputter deposition process comprises, installing a titanium target in said vacuum chamber;

providing an energy source coupled to said vacuum chamber;

flowing hydrogen and argon gas at flow rates into said chamber in a flow ratio, thereby producing a gas pressure in said vacuum chamber;

ionizing said hydrogen and said argon gases using power from said energy source, to form hydrogen and argon ions;

adjusting said argon flow rate, said hydrogen flow rate, said flow ratio, said gas pressure, and said power from said energy source so as to form a $TiH_{x \leq 2}$ layer on said substrate.

18. The process of claim 17 wherein said argon flow rate range is 10–200 SCCM, said hydrogen flow rate range is at least ten percent of said Ar flow rate, said gas pressure range is 2–12 mTorr, and said power range is 5–24 KW.

19. An integrated circuit manufacturing process for making a titanium nitride/titanium bilayer on a substrate having at least one semiconductor device thereon, said substrate having a silicon dioxide surface region thereon, comprising the steps of, installing said substrate in a vacuum chamber;

depositing a layer comprising Ti and H in the form $TiH_{x \leq 2}$ onto said silicon dioxide region of said substrate;

introducing a nitrogen bearing gas into said vacuum chamber after depositing said $TiH_{x \leq 2}$ layer and before said $TiH_{x \leq 2}$ layer is exposed to an ambient atmosphere, annealing said $TiH_{x \leq 2}$ layer at a temperature high enough to cause Ti from said $TiH_{x \leq 2}$ layer to react with nitrogen from said nitrogen bearing gas to form a TiN layer atop a titanium layer.

20. The process of claim 19, wherein said $TiH_{x \leq 2}$ depositing step is a reactive sputter deposition process.

21. The process of claim 20, wherein said reactive sputter deposition process comprises, installing a titanium target in said vacuum chamber;

providing an energy source coupled to said vacuum chamber;

flowing hydrogen and argon gas at flow rates into said chamber in a flow ratio, thereby producing a gas pressure in said vacuum chamber;

ionizing said hydrogen and said argon gases using power from said energy source, to form hydrogen and argon ions;

adjusting said argon flow rate, said hydrogen flow rate, said flow ratio, said gas pressure, and said power from said energy source so as to form a $TiH_{x \leq 2}$ layer on said substrate.

22. The process of claim 19, wherein said annealing step comprises a rapid thermal anneal.

23. The process of claim 22, wherein said $TiH_{x \leq 2}$ depositing step is a reactive sputter deposition process.

24. The process of claim 23, wherein said reactive sputter deposition process comprises, installing a titanium target in said vacuum chamber;

providing an energy source coupled to said vacuum chamber;

flowing hydrogen and argon gas at flow rates into said chamber in a flow ratio, thereby producing a gas pressure in said vacuum chamber;

ionizing said hydrogen and said argon gases using power from said energy source, to form hydrogen and argon ions;

adjusting said argon flow rate, said hydrogen flow rate, said flow ratio, said gas pressure, and said power from said energy source so as to form a $TiH_{x \leq 2}$ layer on said substrate.

25. The process of claim 24 wherein said argon flow rate range is 10–200 SCCM, said hydrogen flow rate range is at least ten percent of said Ar flow rate, said gas pressure range is 2–12 mTorr, and said power range is 5–24 KW.

* * * * *